United States Patent
Pathak et al.

[11] Patent Number: 5,936,444
[45] Date of Patent: Aug. 10, 1999

[54] ZERO POWER POWER-ON RESET CIRCUIT

[75] Inventors: Jagdish Pathak; Saroj Pathak, both of Los Altos Hills; Glen A. Rosendale, Santa Clara; James E. Payne, Boulder Creek; Nianglamching Hangzo, San Jose, all of Calif.

[73] Assignee: Atmel Corporation, San Jose, Calif.

[21] Appl. No.: 08/977,779

[22] Filed: Nov. 25, 1997

[51] Int. Cl.[6] ............................................. H03K 17/22
[52] U.S. Cl. ..................... 327/143; 327/142; 327/198; 327/546
[58] Field of Search ..................... 327/142, 143, 327/198, 544–546

[56] References Cited

U.S. PATENT DOCUMENTS

| | | | |
|---|---|---|---|
| 4,409,501 | 10/1983 | Eickerman et al. | 327/143 |
| 4,634,904 | 1/1987 | Wong | 327/143 |
| 4,746,822 | 5/1988 | Mahoney | 327/142 |
| 4,900,950 | 2/1990 | Dubujet | 327/143 |
| 5,703,510 | 12/1997 | Iketani et al. | 327/143 |
| 5,821,788 | 10/1998 | Pascucci et al. | 327/143 |
| 5,912,001 | 9/1998 | Imamiya | 327/198 |

*Primary Examiner*—Kenneth B. Wells
*Assistant Examiner*—Minh Nguyen
*Attorney, Agent, or Firm*—Thomas Schneck; George B. F. Yee

[57] ABSTRACT

A power-on-reset circuit includes a first charging stage for building up a charge during power up. The rising voltage of the first charging stage is sensed and used to control means for charging up a second charging stage. When the second charging stage reaches a first voltage level, a circuit is tripped to pull the potential of the first to ground. The grounding of the first charging stage is fed back to the charging means which shuts off its power burning components and maintains the first voltage level at the second charging stage.

27 Claims, 1 Drawing Sheet

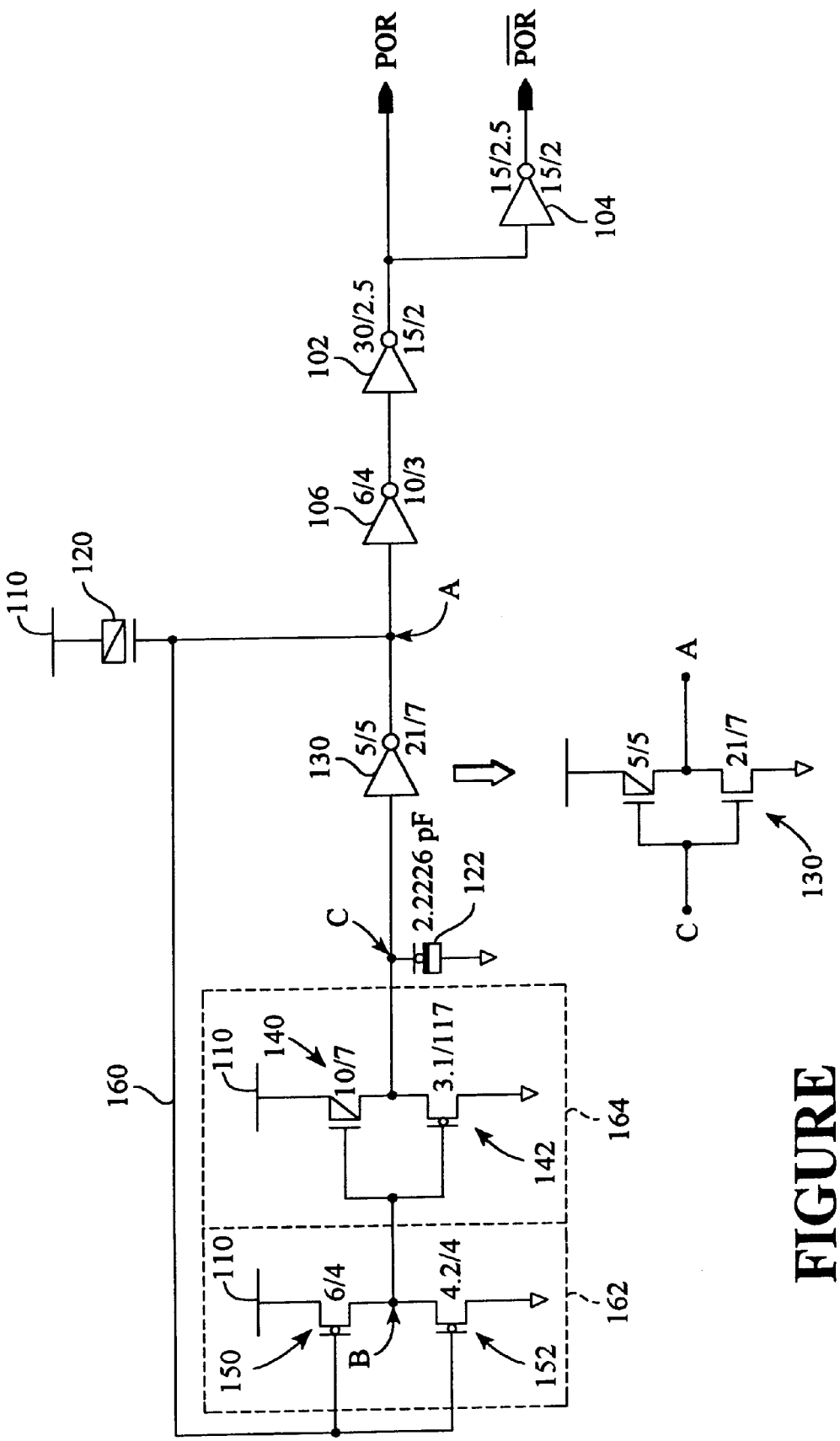
FIGURE

ZERO POWER POWER-ON RESET CIRCUIT

TECHNICAL FIELD

The present invention relates to power-on reset circuits and more specifically to power-on reset circuits used in semiconductor devices.

BACKGROUND ART

When power ($V_{cc}$) is applied to a semiconductor device, the various components comprising the device receive power in an essentially random fashion. One potential outcome is an indeterminate state when $V_{cc}$ reaches a steady-state level. Similarly, some components such as flip-flops require a settling time for the components to reach a steady operating condition. Thus a circuit, referred to as a power-on reset (POR) circuit, is employed to ensure that the components of a semiconductor device remain in a reset state until a stable $V_{cc}$ is attained. The POR holds the device components in reset with a reset signal which is removed when steady state conditions are attained.

With increasing use of laptop computers, personal digital devices such as PDAs, cell phones and so on, there is an increased awareness to maintaining a low power consumption. A prime area of consideration is the design of POR circuits. Such circuits come into play only during the power-on cycle, and ideally become inactive and consume no power afterward. It is thus desirable to have a POR circuit that is capable of turning itself off in order to conserve power during its inactive (or steady state) condition.

SUMMARY OF THE INVENTION

A power-on reset circuit comprises a first charging means coupled between a power supply terminal and a node A. The potential at node A drives a first circuit consisting of first and second series coupled transistors, having an output which follows the potential at node A. The output is coupled to a second circuit consisting of third and fourth transistors, having an output which charges a capacitor coupled between the input of the inverter and ground, thus completing a feedback circuit to node A. The second circuit responds to the output of the first circuit by delaying for a period of time before actually charging the capacitor.

In a preferred embodiment, the charging means is a capacitor coupled between the power supply terminal and node A. The transistors of the first circuit are N-channel zero threshold devices. The transistors in the second circuit include a P-channel device and an N-channel device, the N-channel device also being a zero threshold voltage device.

BRIEF DESCRIPTION OF THE DRAWING

The FIGURE shows a schematic diagram of the POR circuit of the present invention.

BEST MODE OF CARRYING OUT THE INVENTION

With reference to the FIGURE, the power-on reset circuit 100 of the present invention comprises two outputs POR and $\overline{POR}$, respectively providing a reset signal and an active low reset signal at the front end of circuit 100. The POR signal is driven by inverters 106 and 102, and the $\overline{POR}$ signal is driven by inverter 104 which simply inverts the output of inverter 102. The width-to-length (W/L) ratios of the transistors comprising each inverter are given. The top ratio specifies the device dimensions for the P-channel device, while the bottom ratio specifies the dimensions for the N-channel device. This is exemplified in the FIGURE by the internal representation of inverter 130, showing the transistors and their corresponding W/L ratios. In addition to the inverters, the W/L ratios of the transistors comprising the circuit are also shown in the FIGURE.

The back end of the power-on reset circuit includes a voltage detection stage 162 comprising N-channel transistor 150 having a source-drain coupling between a power rail 110 and a node B. N-channel transistor 152 has a similar source-drain coupling between node B and ground. Each N-channel transistor 150, 152 is a zero threshold voltage ($V_t=0$ V) device.

Moving forward, node B is coupled to the gates of transistors 140 and 142 which constitute charging circuit 164. Transistor 140 is a P-channel device having a source coupled to power rail 110 and a drain coupled to the drain of an N-channel, zero threshold voltage transistor 142. The source of transistor 142 is coupled to ground.

Continuing forward, the drain-drain connection node C of the 140/142 transistor pair is coupled to the input to inverter 130. Node C is also coupled to ground via capacitor 122. The output of inverter 130 is coupled to node A which in turn is coupled to power rail 110 via capacitor 120. A feedback path 160 is provided from node A to drive the gates of transistors 150 and 152.

In operation, when power is initially applied to the circuit, power rail 110 begins ramping up from zero volts. The voltage $V_A$ at node A follows the voltage $V_{power\ rail}$ at power rail 110 as capacitor 120 begins to charge. As $V_A$ increases above 0 V, transistors 150, 152 begin to turn on. Since the gate of transistor 152 is coupled to node A, it immediately begins to conduct, recalling that transistor 152 has a source coupled to ground and $V_t=0$ V, and will continue to do so during the power-up sequence since the condition $V_A \geq 0$ V holds during power-up. This has the effect of lowering the potential $V_B$ of node B to ground potential. Consequently, transistor 150 begins to turn on, since its $V_{gs}$ too is greater than $V_t=0$ V. This tends to drive $V_B$ from ground potential to $V_{power\ rail}$. However, the gate-source capacitance of transistor 142 is large; observe in the FIGURE that the W/L ratio for transistor 142 is 3.1/117. This has the effect of delaying the rise of $V_B$ and, as a result, $V_B$ will lag behind $V_{power\ rail}$.

Continuing with the next stage, if $V_B$ lags behind $V_{power\ rail}$ by a sufficient amount, P-channel transistor 140 will begin to turn on, thus allowing a charge to accumulate on capacitor 122. As $V_B$ continues to rise, transistor 142 begins to turn on, since its $V_t=0$ V and $V_B$ is positive. This will tend to slow the charge time of capacitor 122 as the charge flowing from transistor 140 is divided between capacitor 122 and transistor 142. As the capacitor charges, the voltage $V_C$ at node C begins to rise. $V_C$ continues to rise until it reaches the trip point of inverter 130, namely the threshold voltage of the N-channel device comprising the inverter. When that happens node A is coupled to ground via the N-channel device of inverter 130, thus taking the voltage $V_A$ at node A to ground.

As a consequence, the gate potential of transistors 150, 152 go to ground because of the feedback path 160 from node A to the gates of the transistors. Since $V_B$ is positive at this point, the effect of grounding the gate of transistor 150 is to turn the transistor off, since its $V_{gs}$ becomes less than the transistor's threshold voltage. However, transistor 152 remains on, since $V_{gs}=0$ V and its $V_t$ is 0 V. This combination of circumstances tends to drive $V_B$ to ground potential. Though $V_B$ goes to ground, transistor 150 remains off even though the gate potential is at 0 V and $V_B$ is at 0 V. Any tendency for transistor 150 to turn on will drive $V_B$ above the transistor's gate potential, which remains at 0 V by virtue of the feedback path 160 to node A, and thus turn itself off (recall that $V_t=0$ V). $V_B$ is driven back to ground through transistor 152 and in this way, $V_B$ is maintained at ground potential.

P-channel transistor 140 remains turned on since $V_{gs}=V_B-V_{power\,rail}$, which at this point is less than the transistor's $V_t$. Capacitor 122 maintains its charge via transistor 140, thus maintaining a HI at the input of inverter 130 and producing a constant LO (i.e. ground) at its output. Thus node A remains grounded. Consequently, transistors 150, 152 are maintained in their current state (via feedback path 160); i.e. transistor 152 is turned on (because $V_g=V_t=0$ V) and transistor 150 remains off since any tendency for the transistor to turn on will be counteracted by the rising of $V_B$ above its gate potential. With $V_B$ maintained at ground potential, transistor 140 remains on and transistor 142 is off. This condition presents a logic HI to inverter 130 which outputs a LO, thus holding node A to ground.

Thus, in the steady state condition, it can be seen that there are no power burning stages. Transistor 152 remains on to hold node B at ground potential, and since transistor 150 is off there is no current flow from the power supply through transistor 152. Transistor 140 serves to provide a logic HI to inverter 130, thus maintaining a LO at node A, which is fed back to transistor 152 and so on, maintaining the steady state condition. Capacitor 120 and capacitor 122 maintains its charged state since there is no discharge path and so does not dissipate energy in the steady state condition.

As noted above, the triggering of inverter 130 drives node A to ground thus putting the circuit into a zero power-consuming steady-state condition. There are two factors which affect the triggering of inverter 130. First, is the charge build up of capacitor 122. It is the charging of the capacitor which brings $V_C$ up to a positive voltage. The charge time of capacitor 122 can be adjusted so that the trip point of inverter 130 is not reached until the power reaches the desired voltage level $V_{cc}$. As shown in the FIGURE, a value of 2.2226 pF for capacitor 122 was shown to exhibit the desired effect.

The second factor is the sizing of N-channel transistor 142. The high ground-source capacitance resulting from the large gate area of the transistor (W/L is 3.1/117) permits $V_B$ to lag behind $V_{power\,rail}$. Moreover, $V_B$ must be at a potential sufficiently lower than $V_{power\,rail}$ so that $V_{gs}$ of P-channel transistor 140 becomes less than its threshold voltage, allowing transistor 140 to turn on to charge capacitor 122. Using known simulation and design techniques, it was determined that a W/L ratio of 3.1/117 was adequate.

We claim:

1. A power-on reset circuit comprising:
   charging means for outputting a voltage level in response to a rising power supply voltage;
   first means, electrically coupled to the charging means, for providing a ground potential in response to a trigger signal, the first means adapted to hold the voltage level of the charging means at ground potential when triggered; and
   second means, electrically coupled to the first means, for providing a trigger signal in response to a rising voltage level at the charging means, the second means adapted to trigger the first means, the second means including a pair of series-coupled zero voltage threshold transistors;
   a feedback path coupling the charging means to the pair of zero voltage threshold transistors.

2. The reset circuit of claim 1 wherein the charging means is a first capacitor coupled between the power supply voltage and a first node, thereby producing a rising voltage level as a power supply begins to increase in voltage.

3. The reset circuit of claim 2 wherein the first means is an inverter having an input to receive the trigger signal and having an output coupled to the first node.

4. The reset circuit of claim 3 wherein the second means includes a second capacitor coupled between the inverter input and ground, the trigger signal being a first voltage potential across the second capacitor.

5. The reset circuit of claim 4 wherein the second means further includes a circuit for charging the second capacitor to a level equal to the first voltage potential, in response to the rising voltage level of the charging means.

6. The reset circuit of claim 3 wherein the second means further includes:
   a second capacitor coupled between the inverter input and ground; and
   a P-channel device coupled in series with an N-channel device at a second node, the second node being coupled to the second capacitor to be charged thereby;
   the pair of zero voltage threshold transistors coupled at a third node, the third node being coupled to the gates of the P-channel and the N-channel devices;
   the feedback path coupling the first node to the gate of each of the zero voltage threshold transistors.

7. The reset circuit of claim 6 wherein the N-channel device is a zero threshold voltage device.

8. A power-on reset circuit comprising:
   first means for raising the potential at a node A as a power supply voltage increases;
   second means, electrically coupled to node A, for raising the potential at a second node B in response to a rising potential at node A, the second means including first and second series-coupled, N-channel transistors, coupled at node B, gates of the N-channel transistors coupled to node A;
   third means, electrically coupled to node B, for raising the potential at a third node C in response to a rising potential at node B, the third means having means for delaying the onset of raising the potential at node C; and
   fourth means for holding the potential at node A to ground in response to node C reaching a first voltage level, the fourth means having an input electrically coupled to node C to receive the potential at node C, the fourth means further having an output electrically coupled to node A.

9. The reset circuit of claim 8 further including an inverter having an input coupled to node A, an output of the inverter providing a reset signal.

10. The reset circuit of claim 8 wherein the fourth means is an inverter and the first voltage level is the trip point of the inverter.

11. The reset circuit of claim 8 further including a power supply terminal and a ground terminal, wherein the first means is a first capacitor coupled between the power supply and ground terminals.

12. The reset circuit of claim 8 wherein the N-channel transistors are zero threshold voltage devices.

13. The reset circuit of claim 8 wherein the third means includes a P-channel transistor having source and drain terminals coupled between the power supply terminal and node C, and having a gate coupled to node B.

14. The reset circuit of claim 13 wherein the means for delaying is an N-channel, zero threshold voltage device having drain and source terminals coupled between node C and ground, and having a gate coupled to node B.

15. The reset circuit of claim 14 wherein the third means further includes a second capacitor coupled between node C and ground.

16. The reset circuit of claim 13 wherein the first and second N-channel transistors are zero threshold voltage devices.

17. A power-on reset circuit comprising:

a first terminal for connection to a first potential;

a second terminal for connection to a second potential;

a first capacitor coupled between the first terminal and a first node;

an inverter having an input and an output, the output coupled to the first node;

a second capacitor coupled between the input of the inverter and the second terminal;

first means, electrically coupled to the first node, for outputting a voltage level that follows the potential of the first node, the first means including a pair of series-connected N-channel transistors coupled between the first and second terminals, a gate of each of the transistors being coupled to the first node; and second means for charging the second capacitor, the second means having an input coupled to receive the output voltage of the first means, the second means further having an output coupled to the second capacitor.

18. The reset circuit of claim 17 wherein the second means includes means for delaying the onset of the charging of the second capacitor.

19. The reset circuit of claim 17 wherein each of the transistors has a zero threshold voltage.

20. The reset circuit of claim 17 wherein the pair of transistors is coupled at a second node; the second means includes a P-channel transistor and an N-channel transistor coupled in series between the first and second terminals, a gate of each being coupled to the second node; and a source of the P-channel transistor and a drain of the N-channel transistor are coupled to charge the second capacitor.

21. The reset circuit of claim 17 wherein the first terminal is a power supply rail and the second terminal is a ground rail.

22. A power-on reset circuit comprising:

a power connection;

a ground connection;

an output node A;

a first capacitor coupled between the power node and the output node;

first and second transistors coupled in series between the power connection and the ground connection, the first and second transistors coupled together at a node B;

third and fourth transistors coupled in series between the power connection and the ground connection, the third and fourth transistors coupled together at a node C, the third and fourth transistors each having a gate coupled to node B;

a second capacitor coupled between node C and the ground connection;

a first inverter having an input coupled to node C and an output coupled to node A; and a feedback path coupling the output node to gate terminals of the first and second transistors.

23. The reset circuit of claim 22 wherein the first and second transistors are zero threshold voltage N-channel devices.

24. The reset circuit of claim 22 wherein the third transistor is a P-channel device and the fourth transistor is a zero threshold voltage N-channel device.

25. The reset circuit of claim 22 wherein the first and second transistors are zero threshold voltage N-channel devices, the third transistor is a P-channel device, and the fourth transistor is a zero threshold voltage N-channel device.

26. The reset circuit of claim 25 further including a second inverter having an input coupled to the output node, whereby the output node serves as a reset signal and an output of the second inverter serves as a complement of the reset signal.

27. The reset circuit of claim 26 further including a third inverter having an input coupled to the output of the second inverter, and a fourth inverter coupled to an output of the third inverter, whereby the output of the third inverter serves as the reset signal and an output of the fourth inverter serves as a complement of the reset signal.

* * * * *